United States Patent [19]
d'Alayer de Costemore d'Arc

[11] Patent Number: 5,271,063
[45] Date of Patent: Dec. 14, 1993

[54] CONTROLS FOR A VEHICLE AUDIO/VIDEO APPARATUS

[75] Inventor: Stephane M. d'Alayer de Costemore d'Arc, Brussels, Belgium

[73] Assignee: Staar S.A., Brussels, Belgium

[21] Appl. No.: 771,098

[22] Filed: Oct. 4, 1991

[51] Int. Cl.$^5$ .............................................. H03G 3/00
[52] U.S. Cl. ..................................... 381/104; 381/86; 381/102; 381/103; 381/107
[58] Field of Search ................ 381/86, 101, 102, 103, 381/104, 98, 107

[56] References Cited
U.S. PATENT DOCUMENTS 4,746,919  5/1988  Reitmeier.
4,903,307  2/1990  Ozawa et al. ..................... 381/103

FOREIGN PATENT DOCUMENTS 373387  6/1990  European Pat. Off..
2188458  9/1987  United Kingdom.

Primary Examiner—Jin F. Ng
Assistant Examiner—Nina Tong
Attorney, Agent, or Firm—Leydig, Voit & Mayer

[57] ABSTRACT

A apparatus and method for permitting perception of the nature of a selected function of an audio/video reproduction apparatus by varying an adjustment of the function selected. The selected function (such as speaker balance, bass, treble, or fade) is identified to the user by automatically varying the adjustment of the selected function between two predetermined settings. This allows the user to adjust the audio/video apparatus without distracting his attention from the road in a moving vehicle.

18 Claims, 2 Drawing Sheets

CONTROLS FOR A VEHICLE AUDIO/VIDEO APPARATUS

The present invention relates to mechanisms for controlling audio/video reproduction apparatuses and, more particularly, for setting levels for such functions as sound volume, bass level, treble level, and balancing the relative sound volume levels between loudspeakers of apparatuses such as radios, and audio and video cassette players which are installed in motor vehicles.

Many knobs and functions on the front of an audio/video reproduction apparatus relate to controlling characteristics of the audio output signals. A typical apparatus outputs several independent audio signals on respective audio channels. The output audio signals power a plurality of loudspeakers which are respectively connected to the audio channels. A typical configuration is a motor vehicle which contains a left front, right front, left rear, and right rear loud speaker. Balance refers to an ability to adjust the relative sound volume between the loudspeakers on the left and right sides of the vehicle. A balance function enables a user to establish an equilibrium between the left and right loudspeakers based on the user's preference. Fade function refers to an ability to control the relative volume between loudspeakers located in the front and rear of the vehicle. A fade control function allows the user to establish an equilibrium between the front and rear speakers based on the user's preference. The term stereophonic refers to an ability of the audio/video apparatus to reproduce different sounds on loudspeakers connected to different audio channels. Sound equalization refers to an ability of the audio/video apparatus to alter the audio output of one or more audio channels by changing the relative amplitude of all frequencies (balance function) or of some frequency components, such as low frequencies (base function), or high frequencies (treble function).

A typical audio/video apparatus contains a profusion of control knobs, having a single knob for each function. This arrangement is unsatisfactory in a motor vehicle since a driver must momentarily divert attention from the road to determine which knob, from the large number of knobs, is the knob one wishes to adjust.

Alternatively, some apparatuses contain a single function selecting control used to select a function to be adjusted and a single adjustment control used to adjust the function selected. As the function selecting control is manipulated, a display panel displays the function currently selected. The adjustment control is then manipulated to adjust the function. This arrangement is also unsatisfactory because, in order to determine which function is selected, the driver's attention is momentarily distracted to read the function displayed on the front panel of the apparatus. Additionally, the display is often difficult for the driver to read.

In some situations, there are numerous drivers for a single vehicle (e.g. company cars, rented vehicles etc.). The new driver rarely consults the instruction manual of the audio/video apparatus before driving. Consequently, the new driver determines how the apparatus operates at the same time he is driving. This can be dangerous since the drivers attention will be distracted from the road. Thus, the above mentioned audio/video function selection techniques are unsatisfactory.

One device is known which addresses such audio/video function selection problems by recognizing adjustment commands rendered by voice. However, the device requires that the user previously record the commands in such a manner that the apparatus is able to recognize voice instructions and carry out the appropriate adjustments. The device substantially increases the price of the apparatus which is undesirable. Additionally, this recorded voice arrangement is very complicated for the average user and can only be controlled by a single user.

SUMMARY OF THE INVENTION

The main object of the present invention is to alleviate the above-mentioned disadvantages by providing a simple, economical, and easy to operate control mechanism which permits the user to select and actuate the desired control without having to divert his attention from the road. A further object of this invention is to provide the added functionality without significantly increasing the cost of the apparatus.

The present invention achieves these objects and overcomes the aforesaid problems by providing a simple, reliable control apparatus that provides an identification program in which the different functions are identified by automatically varying each function between pre-established levels in a user perceptible manner that can be recognized by a user, and which then provides for the user to adjust each function to a desired level determined by the user. According to the invention, once the control apparatus enters the identification program, each of the sound equalization characteristics of an audio output are automatically varied between two different audibly perceptible levels. This enables the user to recognize each function. The identification program then permits the user to adjust each function to suit the user's preferences.

An apparatus constructed according to the present invention includes: selecting means for selecting a function of an audio/video apparatus; function determining means for automatically actuating the function selected and for identifying the function selected by varying the function between two different levels to enable recognition of the function actually selected; and adjusting means for adjusting the function selected.

The operation of one embodiment of the invention can be illustrated using the balance function. A first actuation of a function selecting control causes the apparatus to enter the balance adjustment mode. In order to enable the user to recognize that this function is activated without distracting attention from the road, the stereophonic balance is cycled by alternatively varying the relative volume between the left and right audio channel. For example, audio reproduction is enabled on only the left channel, then after the lapse of the short time interval, only on the right channel, and repeatedly cycled between left and right channels for a predetermined time period. Once the user recognizes that the function selecting control is set to the balance function, the user is free to actuate the function adjustment control to adjust the stereophonic balance. A new actuation of the function selecting control, advances the apparatus to a new function (i.e. fade), and the process is repeated by varying the relative volume of the front and rear speakers. Other functions may be identified in a similar manner.

A method is also provided which permits the user to perceive the nature of a selected function of an apparatus for audio/video reproduction. The method includes the steps of: selecting a function of an audio/video apparatus; automatically actuating the function selected by varying the function between two different levels, enabling the user to recognize the function actually selected; and allowing the user to adjust the function selected.

Additional advantages and characteristics of the invention appear in the description of a preferred embodiment described hereinafter.

DESCRIPTION OF THE PREFERRED EMBODIMENTS

Figure 1:
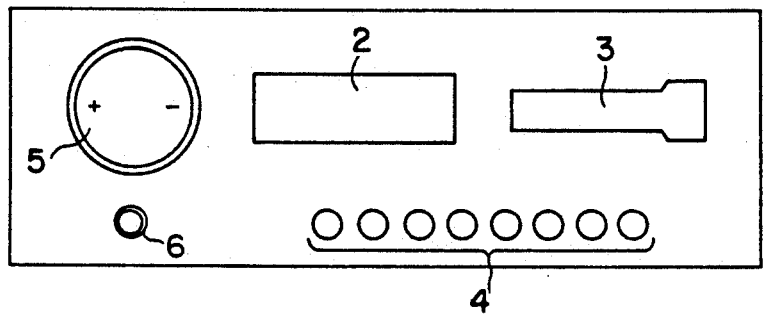
FIG. 1 is a front view of a car radio-cassette apparatus incorporating an embodiment of the invention.

Referring to FIG. 1, a car radio-cassette player incorporates a display panel 2, a tape insertion slot 3 (permitting the insertion or ejection of a cassette), a plurality of radio frequency selection controls 4 (permitting the storage and selection of preferred radio broadcasting stations), and a function adjustment control 5 associated with a function selecting control 6.

Figure 2:
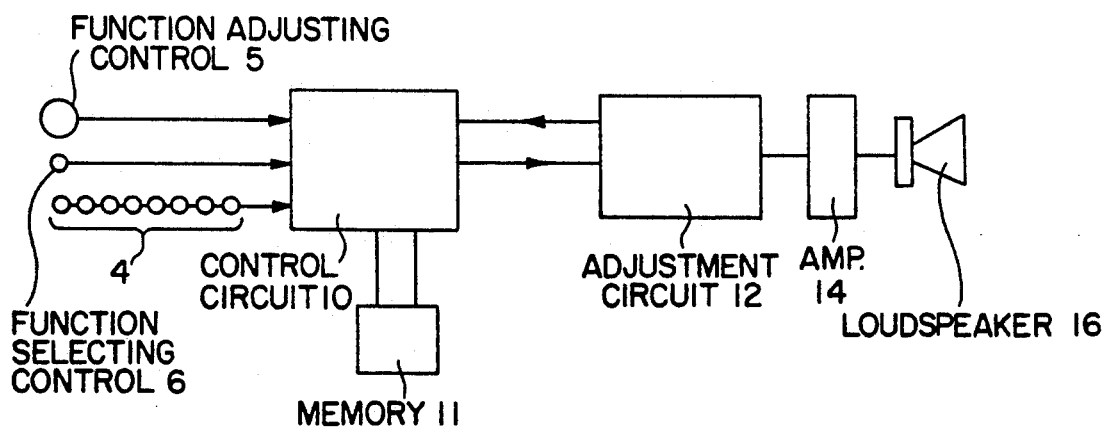
FIG. 2 is a block diagram of the circuit incorporated in the apparatus shown in FIG. 1.

Referring to FIG. 2, which is a block diagram of the electronic circuitry incorporated in the apparatus of FIG. 1, a control unit 10 is associated with a memory 11. The control unit 10 includes a microprocessor executing a program of prerecorded instructions stored in the memory 11. The memory 11 may be located on either inside or outside of the microprocessor. An adjustment circuit 12, inputs one or more audio signals, modifies the audio signals in accordance with sound equalization instructions received from the control unit 10 (i.e. volume, fade, treble, bass, etc.), and outputs the equalized audio signals to the amplification circuit 14. The amplification circuit 14 amplifies the audio signals and transmits them to one or more loudspeakers 16.

The adjustment circuit 12 may be of the "SOFAC" type used in some audio/video systems (see, for example, Phillips car radio-cassette n° 22DC774). The amplification circuit 14 may be used as either an amplifier or a preamplifier. The knobs controlling the functions and adjustments of the apparatus may be linked to the control unit 10 or to the adjustment circuit 12, depending on whether an intercommunication bus exists between these two circuits.

In commercially available units, the function selecting control 6 is used to select a particular function of the apparatus such as base, treble, balance and fade adjustment. The function currently selected is displayed on the display panel 2. A new function can be selected by again actuating the function selecting control 6. In this manner, all functions of the apparatus can be cycled by using a single function selecting control 6. A function adjustment control 5 is provided to adjust the function selected. However, in commercially available units the user must read the display panel 2 each time that the function selecting control 5 is pressed to determine which function is currently selected. Such apparatus incorporates a "I²C Bus" interconnecting the control unit 10 and the adjustment circuit 12. Additionally, the function controls 4, 5 and 6 are connected to the inputs of the control unit 10.

According to the present invention, upon powering-up, the control unit 10 is activated and enters an initial state which recalls initial parameters stored in memory 11. The parameters are used to initialize settings of the audio function. In a preferred embodiment, the default setting for the function adjustment control 5 is to control the sound volume of the apparatus. After initialization, in keeping with the invention, the control unit 10 actuates and executes an identification program of prerecorded instructions which is stored in the memory 11. This identification program modifies the functions of the function selecting control 6.

Figure 3:
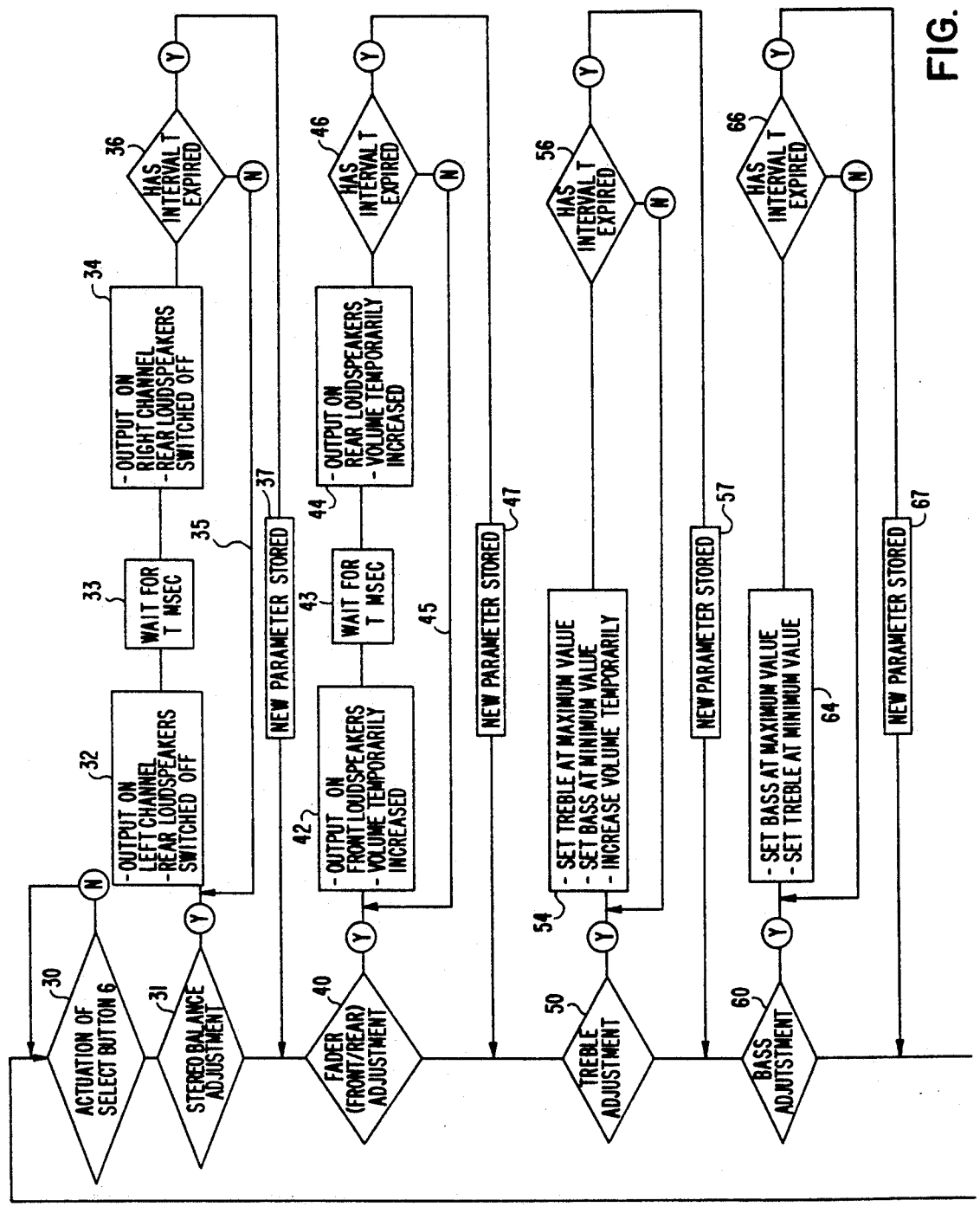
FIG. 3 is a flow diagram of a program of prerecorded instructions enabling the implementation of the apparatus shown in FIG. 1.

FIG. 3 is a flow diagram of the prerecorded instructions contained in memory 11 and executed in the control unit 10. Referring to FIG. 3, as indicated in the first block 30, whenever the function selecting control 6 is not actuated, the function of the function adjustment control 5 is to control the sound volume which can be increased or decreased at will by the user. This function is chosen because of its frequency of use, but any other priority function can be chosen arbitrarily. A first actuation of the function selecting control 6 causes the program to enter the balance adjustment mode 31. In order to enable the user to recognize that this function is activated without distracting attention from the road, the balance is cycled by alternatively varying the relative volume between a left and a right loudspeaker. Both of the rear loudspeakers are desirably turned off for this adjustment. The program in the memory 11 instructs the control unit 10 to automatically enable the adjustment circuit 12 to vary the balance between the left and the right loudspeaker. For example, balance is varied by enabling reproduction on only the left channel 32, then after the lapse of a short time interval 33 (e.g. t=approximately 300 milliseconds) enabling only the right channel 34, and then enabling the channels alternately and/or successively for a predetermined time period 35 (approximately 2-3 seconds).

The predetermined time period may be interrupted at any time by the user again actuating the function selecting control 6, or the function adjustment control 5. Once the user recognizes that the function selecting control 6 is set to the balance function, the user is free to actuate the function adjustment control 5 and thereby adjust the balance.

Within a predetermined time period 36 (approximately 3-4 seconds), the user may adjust the balance between the left and right speaker by manipulating the function adjustment control 5. If a new value is input by the user, the balance function is set to this value and stored for future use 37. If no modification was made by the user, the apparatus retains the old balance level, and advances to select the fade function 40 automatically. Alternatively, the function selection is advanced by the user again actuating the function selecting control 6.

In carrying out the invention, the different functions to be identified are successively selected by following the identification program shown in FIG. 3. Thus, the apparatus advances to the fade function 40 and operates in a similar manner as for the balance function previously described. The control unit 10 activates the adjustment circuit 12 to stimulate variations in the balance between front 42 and rear 44 loudspeakers, while momentarily increasing the output volume slightly to help the user recognize the fade function. The fade is alternatively adjusted between the front and the rear loudspeaker corresponding to a predetermined interval 43 so that the user immediately recognizes the function selected. Within a predetermined time period 46, the user can modify the fade between the front and rear loudspeaker by manipulating the function adjustment control 5. If a new value is input by the user, the fade function is set to this value and it is stored for future use 47. If no value is entered after a predetermined period, the fade function is returned to the old value, and the treble level adjustment function is selected. Alternatively, a new actuation of the function selecting control 6 before the predetermined period, will result in the treble level adjustment function being selected.

The apparatus then automatically advances pursuant to the identification program according to the invention to the treble level adjustment function 50 and operates in a similar manner as for the balance and fade functions previously described. To enable user recognition of the treble level adjustment function, the control unit 10 acts on the circuit 12 to switch the treble level to its maximum value 54 while switching the bass level to its minimum value. The variation in the treble occur for a predetermined interval. This enables the user to recognize that the function selecting control 6 is positioned on the treble level adjustment function. Having recognized this function, the user has the option to act on the function adjustment control 5 in order to modify the treble level within the predetermined time period 56. It is preferable to increase the volume slightly during the predetermined interval, and while the treble is being adjusted. If a new value is input by the user, the treble is set to the value and it is stored for future use 57. If no value is input, the previous treble level is restored and the program advances to the bass level adjustment function. Upon expiration of a predetermined time period or a new actuation of the function selecting control 6, the program 60 advances to selecting the bass level adjustment function.

As for the bass level adjustment, the control unit 10 actuates the adjustment circuit 12 in order to make the bass level pass to a maximum level 64, for a predetermined time period while setting the treble level at its minimum value. Having recognized this function, the user has the option to act on the function adjustment control 5 in order to modify the bass level adjustment. If a new value is input by the user, the bass is set to the value and it is stored for future use 67. At the expiration 66 of the predetermined time period or upon actuation of the function selecting control, the program returns to its starting point. In this state, function adjustment control 5 is used exclusively for adjusting of the sound volume of the apparatus.

The apparatus according to the invention has the advantage that the user does not need to locate a particular knob from a multitude of knobs, or turn his visual attention to a screen and thus distract his attention from driving. An additional advantage is that the user need not read the user's manual before operating the apparatus. Additionally, the apparatus does not require any special or additional circuitry since it is based exclusively upon existing circuits. The device only requires a portion of the memory 11 of the control circuit 10. The capacity of the memory can be easily increased if needed. Consequently, this device has the advantage of not significantly increasing the existing cost of the apparatus.

The above embodiment includes provisions for the automatic selection of the various functions and adjustments so that a single actuation of the function selecting control 6 automatically ensures the sequential selecting of the various functions without further user intervention. The user is only required to make adjustments in the functions which he desires. Pressing the function selecting control 6 interrupts the predetermined time period and immediately advances the program to the next function. The device cycles through all of the adjustments without the user having to press the function selecting control 6 to advance to the next adjustment parameter. If desired, this automatic advance feature may be eliminated so that the user manually advances the function selected by manipulating the function selecting control.

In a further embodiment, the functions can be varied between two different pre-established levels, or a plurality of levels, rather than varying the functions between their maximum and minimum level. In the case of small dimension loudspeakers such as those mounted in vehicles, an adjustment of the bass level to the maximum and/or the treble to the minimum may result in saturation of the audio output and generate an unpleasant noise. This can be avoided by varying the parameter between a level which is less than the minimum and maximum levels possible.

An alternative to using time intervals is to measure the cyclic variations by the number of cycles performed. Additionally, the method used to input the function selecting control 6 and the function adjustment control 5 is not critical, and may be made by manual, audio, or remote input mechanisms. Both the function selecting control and the function adjustment control may be provided by a single means.

I claim:

1. An apparatus which assists a user to recognize selected audio/video reproduction functions comprising:

function selection means for selecting different functions which adjust an audible characteristic of an audio/video apparatus;

identifying means including an identification program for identifying each of the different functions to a user by automatically successively selecting the different functions for predetermined time periods and repetitively producing variations in each function during its respective time period between pre-established audibly-perceptible levels, thereby enabling the user to recognize each function by hearing the variations in the function; and adjusting means operable by the user for adjusting the function recognized by the user to a user desired level, sad adjusting means being operable at any time during each respective time period or during an interval established by the identification program after each of the time periods.

2. An apparatus according to claim 1, wherein actuation of said selecting means automatically initiates the identification program for identifying each of the functions selected.

3. An apparatus according to claim 1, wherein a new function is automatically selected after a predetermined time period.

4. An apparatus permitting perception of the nature of sound equalization functions comprising:

audio/video reproduction means having a plurality of sound equalization functions;

adjusting control means for inputting user commands;

adjusting means, responsive to said adjusting control means, for adjusting the plurality of sound equalization functions;

at least one control means for selecting one of the plurality of sound equalization functions; and identification means, responsive to actuation of said at least one control means, for automatically repetitively varying the sound equalization function selected between two different levels, thereby enabling a user to recognize the selected sound equalization function by hearing the different levels.

5. An apparatus according to claim 4, wherein the identification means comprises a microprocessor containing a memory, wherein the microprocessor executes prerecorded instructions stored in the memory.

6. A method for assisting a user to recognize a selected function of an apparatus for audio/video reproduction comprising the steps of:
selecting a function of an audio/video apparatus;
automatically identifying the function selected by repetitively varying the function between two predetermined levels of sound which are audibly perceptible thereby enabling a user to recognize the function actually selected; and
adjusting the function selected.

7. Method according to claim 6, wherein the step of selecting a function occurs first, and enables automatic selection of additional functions after a delay having a predetermined period.

8. Method according to claim 6, wherein the variation of the function is performed cyclically over a predetermined period.

9. Method according to claim 6, wherein the adjusting of the function selected must be performed within a pre-established time period, after which the selecting means restores an initially selected function.

10. An apparatus which assists a user to recognize reproduction functions of an audio/video player comprising:
function selecting control means for selecting different functions which adjust audible characteristics of the audio/video player;
identifying means including an identification program for identifying the different functions to a user by automatically successively selecting the different functions for predetermined time periods and producing variations in audible sound representing time periods and producing variations in audible sound representing each function during its respective time period, thereby enabling the user to recognize each function; and
function adjusting control means for adjusting the function recognized by the user to a user desired level.

11. An apparatus according to claim 10, wherein the identifying means includes a means operated responsive to the identification program for producing audible sound representing a treble function to the user by emphasizing high frequency components.

12. An apparatus according to claim 10, wherein the identifying means includes a means operated responsive to the identification program for producing audible sound representing a treble function to the user by de-emphasizing low frequency components.

13. An apparatus according to claim 10, wherein the identifying means includes a means operated responsive to the identification program for producing audible sound representing a bass function to the user by emphasizing low frequency components.

14. An apparatus according to claim 10, wherein the identifying means includes a means operated responsive to the identification program for producing audible sound representing a bass function to the user by de-emphasizing high frequency components.

15. An apparatus according to claim 10 wherein the audio/video player includes a plurality of different adjustment circuits for adjusting audible characteristics of the respective functions;
the function selecting control means is manually operable and operatively connected to select among each of the different adjustment circuits; and
the identifying means is operable in response to a start signal and modifies the function selecting control means to automatically successively select the different functions for predetermined time periods and produce variations in audible sound representing each function during its respective time period, and
to provide an interval following each time period during which the user may adjust the adjustment circuit corresponding to the recognized function to a user desired level.

16. An apparatus which assists a user to recognize reproduction functions of an audio/video player comprising:
function selecting control means for selecting different functions which adjust audible characteristics of the audio/video player;
identifying means including an identification program for identifying the different functions to a user by automatically successively selecting the different functions for predetermined time periods and producing variations in audible sound representing each function during its respective time period, thereby enabling the user to recognize each function, the identifying means including means operated responsive to the identification program for producing audible sound representing a treble function to the user by emphasizing high frequency components and de-emphasizing low frequency components; and
function adjusting control means for adjusting the function recognized by the user to a user desired level.

17. An apparatus which assists a user to recognize reproduction functions of an audio/video player comprising:
function selecting control means for selecting different functions which adjust audible characteristics of the audio/video player;
identifying means including an identification program for identifying the different functions to a user by automatically successively selecting the different functions for predetermined time periods and producing variations in audible sound representing each function during its respective time period, thereby enabling the user to recognize each function, the identifying means including means operated responsive to the identification program for producing audible sound representing a bass function to the user by emphasizing low frequency components and de-emphasizing high frequency components; and
function adjusting control means for adjusting the function recognized by the user to a user desired level.

18. An apparatus which assists a user to recognize reproduction functions of an audio/video player comprising:

a plurality of different function adjusting circuits for adjusting audible characteristics of the reproduction functions;

manually operable function selecting control means for selecting among the different function adjusting circuits manually;

function adjusting control means operable manually by the user for adjusting to a user desired level each of the functions corresponding to the function adjusting circuits selected by the function selecting control means; and identifying means operable automatically in response to a program start signal for identifying the different functions audibly to a user including means operable in response to a series of program instructions for successively selecting the different function adjusting circuits for predetermined time periods and for adjusting the respective circuits to produce variations in audible sound representing each function during its respective time period, thereby enabling the user to recognize each function, and for providing an interval following each of the predetermined time periods during which the function recognized by the user may be adjusted to a desired level by manually operating the function adjusting control means to adjust the respective circuit.

* * * * *

UNITED STATES PATENT AND TRADEMARK OFFICE
CERTIFICATE OF CORRECTION

PATENT NO. : 5,271,063
DATED : December 14, 1993
INVENTOR(S) : Stephane M. d'Alayer de Costemore d'Arc It is certified that error appears in the above-indentified patent and that said Letters Patent is hereby corrected as shown below:

On the title page of the patent, beneath item [22], insert:

--[30]    Foreign Application Priority Data
   Nov. 19, 1990  [BE]    Belgium............90 01088--.

Column 6, line 48, change "sad" to --said--.

Signed and Sealed this

Sixteenth Day of August, 1994

Attest:

BRUCE LEHMAN

*Attesting Officer*     *Commissioner of Patents and Trademarks*